United States Patent
Zonensain et al.

(10) Patent No.: US 11,703,927 B2
(45) Date of Patent: Jul. 18, 2023

(54) LEAKAGE DEGRADATION CONTROL AND MEASUREMENT

(71) Applicant: Intel Corporation, Santa Clara, CA (US)

(72) Inventors: Oren Zonensain, Ganei Tikva (IL); Roman Rechter, Even Yehuda (IL); Almog Reshef, Rishon Lezion (IL); Maxim Levit, Binyamina (IL); Nadav Shulman, Tel Mond (IL); Efraim Rotem, Haifa (IL)

(73) Assignee: Intel Corporation, Santa Clara, CA (US)

( * ) Notice: Subject to any disclaimer, the term of this patent is extended or adjusted under 35 U.S.C. 154(b) by 148 days.

(21) Appl. No.: 16/833,328

(22) Filed: Mar. 27, 2020

(65) Prior Publication Data
US 2020/0225723 A1 Jul. 16, 2020

(51) Int. Cl.
*G06F 1/00* (2006.01)
*G06F 11/30* (2006.01)
*G06F 1/28* (2006.01)
*G01R 31/52* (2020.01)

(52) U.S. Cl.
CPC ............ *G06F 1/28* (2013.01); *G01R 31/52* (2020.01)

(58) Field of Classification Search
CPC .................... G06F 1/28; G01R 31/52
See application file for complete search history.

(56) References Cited

U.S. PATENT DOCUMENTS

| | | | | |
|---|---|---|---|---|
| 2008/0298155 A1* | 12/2008 | Miyako | ............... | G11C 7/12 365/226 |
| 2009/0309243 A1* | 12/2009 | Carmack | ............... | G06F 1/3203 257/798 |
| 2010/0153954 A1* | 6/2010 | Morrow | ............... | G06F 1/329 718/102 |
| 2011/0011730 A1* | 1/2011 | Valcore, Jr. | ....... | H01J 37/32174 204/192.1 |
| 2011/0026329 A1* | 2/2011 | Wada | ............... | G11C 16/10 327/536 |
| 2011/0221516 A1* | 9/2011 | Yamaoka | ............... | G06F 1/3203 327/538 |
| 2012/0210741 A1* | 8/2012 | Fujiwara | .......... | G10K 11/17881 62/126 |
| 2014/0359328 A1* | 12/2014 | Burns | ............... | G06F 1/324 713/322 |
| 2016/0004288 A1* | 1/2016 | Kruglick | ............... | G06F 1/3203 713/320 |
| 2016/0025794 A1* | 1/2016 | Kim | ............... | H02H 5/12 324/509 |

* cited by examiner

*Primary Examiner* — Mohammed H Rehman
(74) *Attorney, Agent, or Firm* — Schwabe, Williamson & Wyatt, P.C.

(57) ABSTRACT

A performance management scheme for a processor based on leakage current measurement in field. The scheme performs the operations of detection and correction. The operation of detection measures per core leakage current in the field (e.g., using voltage regulator electrical current counters). The operation of correction changes the processor power management behavior. For example, processor cores showing high leakage degradation may be logically swapped with cores showing low leakage degradation.

21 Claims, 7 Drawing Sheets

LEAKAGE DEGRADATION CONTROL AND MEASUREMENT

BACKGROUND

One way to improve performance of a processor (e.g., speed and thus number of executions per second) is to raise the voltage of the supply voltage to the processor. At higher supply voltage levels, the operating frequency of the processor also increases. As operating frequency of the processor increases, so does its number of executions per second, and hence performance increases. However, operating the processor at high supply voltages (e.g., greater than 1.0V) requires careful evaluation of performance and reliability tradeoffs. At higher supply voltages, transistors may reach their breakdown point faster. For example, transistor gate oxide may damage causing the transistor to breakdown at higher supply voltages. Operating transistors at higher supply voltages may also result in higher drive current through the transistors, which may cause electro-migration issues in interconnect.

Figure 1:
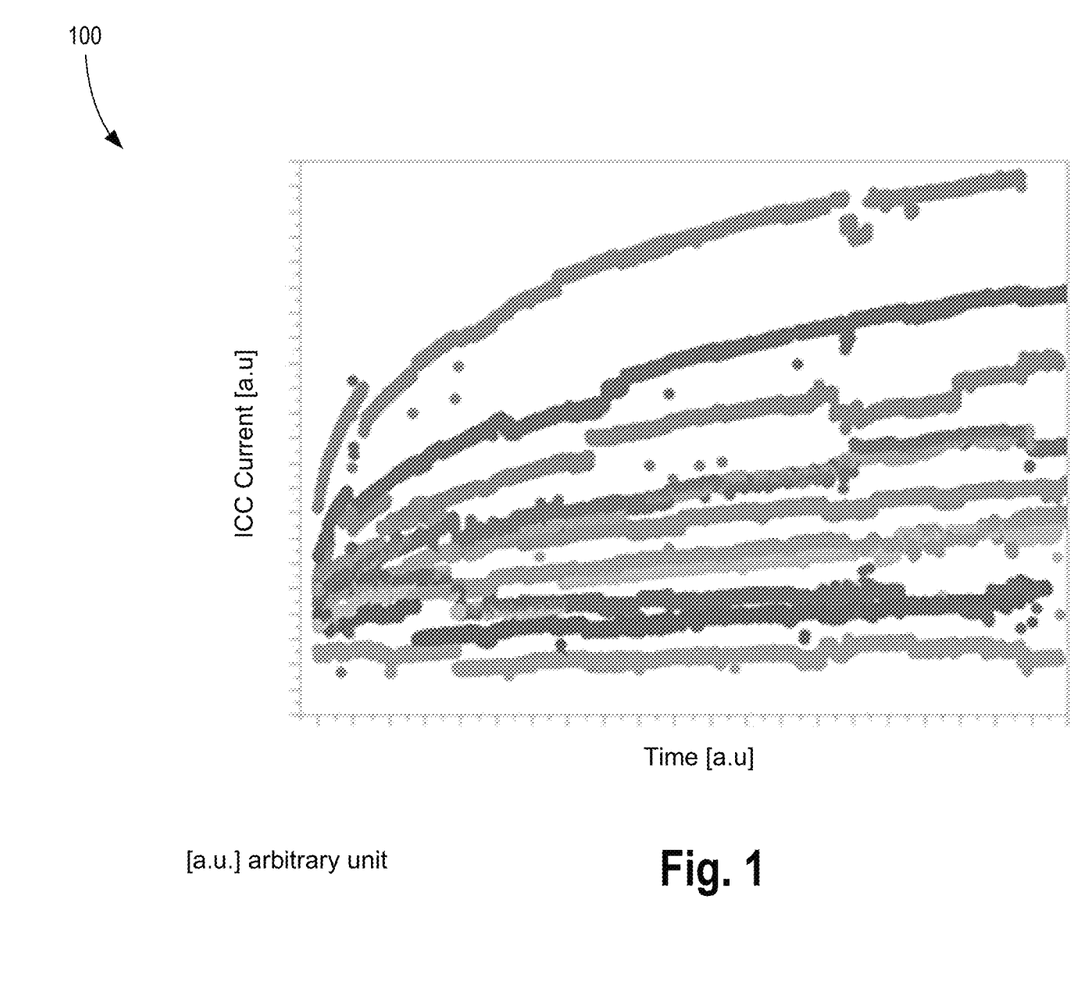
FIG. 1 illustrates plot showing total current consumption (ICC) over time in a processor.

FIG. 1 illustrates plot 100 showing total current consumption (ICC) over time. Plot 100 illustrates that as a processor is stressed (e.g., via different kinds of workloads) over time at high supply voltages (e.g., greater than 1.0V supply on a modern complementary metal oxide (CMOS) process technology node), current consumption of the processor increases. In some cases, the leakage current consumption of the processor for the same workload increases up to 50% after extended stress time (e.g., thousands of hours).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 2A:
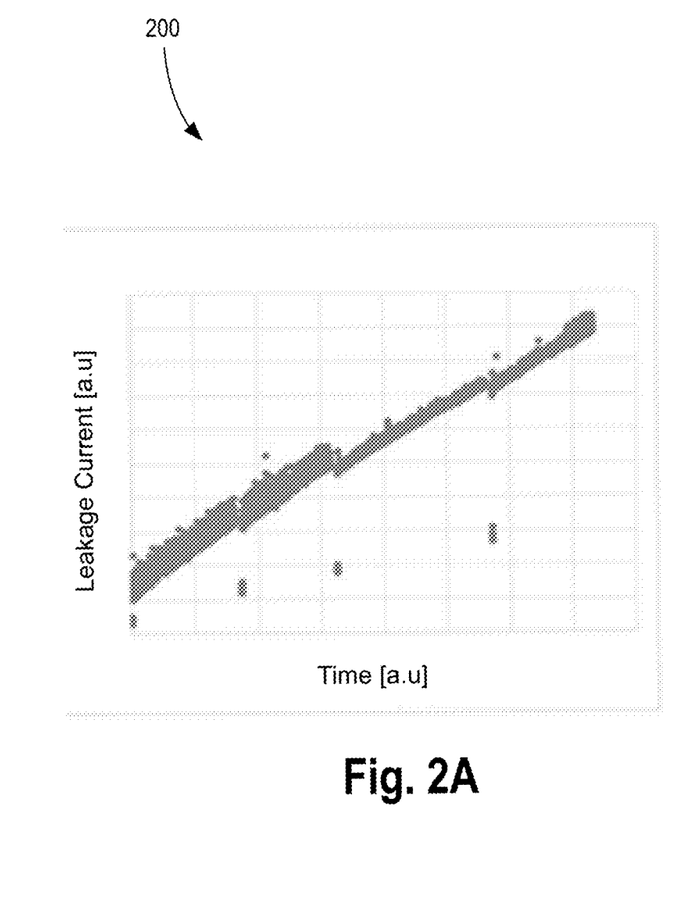
FIGS. 2A-B illustrate plots showing leakage current degradation and temperature, respectively, between different processor cores of the same processor.
Figure 2B:
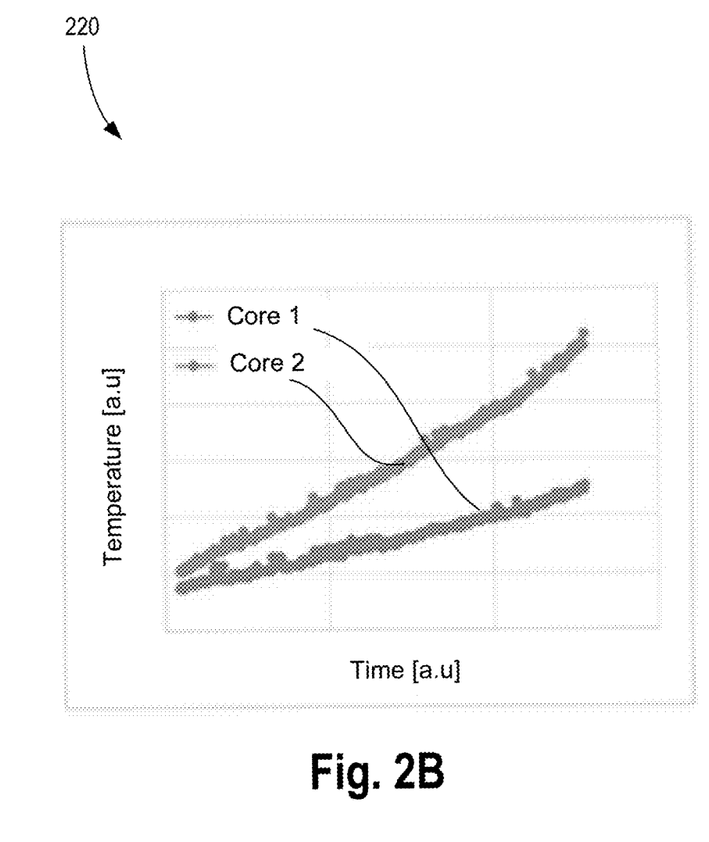

FIGS. 2A-B illustrate plots 200 and 220 showing leakage current degradation and temperature, respectively between different processor cores of the same processor. Plots 200 and 220 illustrate that in a multicore processor (e.g., a processor having more than one processing cores), each core may behave differently with respect to leakage degradation. For example, there is core-to-core variability within a multicore processor with respect to temperature caused by leakage degradation. Plot 200 shows how leakage or standby current increases over time while dynamic current is largely not impacted over time. Plot 220 shows the variability in temperature for two cores (e.g., core 0 and core 1) over time. The leakage degradation causes temperature of the cores to rise differently over time. The substantial temperature differences between the cores strongly suggests the effect of core-to-core variation with respect to leakage degradation. Plot 220 shows that each core may need separate mitigation for leakage degradation.

Substantial current consumption increase can lead to negative results during processor use. For example, blue screen or computer hang/stall indicating a broken processing system due to under-voltage is caused by the substantial increase in current consumption over time. Substantial current consumption increase can also lead to product performance degradation. For example, the heating solution may fail. Substantial current consumption can increase power consumption above stated specifications of the processor.

Since current consumption degradation is becoming a high-risk reliability item, further increase in supply voltage for a processor may not be possible until this effect is mitigated. This effect is expected to increase with device area, thus multi-core and server products are even at higher risk to be constrained. One way of mitigation is to have a higher power headroom for all processor units to allow for degradation. However, such a processor may have a high negative impact to product manufacturability and customer appeal.

Typically for processors, a beginning-of-life (BoL) leakage number is stored in a non-volatile memory such as a fused register. In some embodiments, BoL leakage is used by the processors to gauge the degradation of leakage current over time. Some embodiments describe an apparatus and scheme to eliminate the high end-of-life (EoL) guard band (e.g., power, frequency, and/or voltage guard band) due to leakage degradation and replace it with a reactive control by tracking the actual leakage compared to the fused BoL leakage. Various embodiments mitigate this leakage current degradation effect and gain significant performance benefit by enabling continuation of further increase in operating voltage. The embodiments use a performance management scheme based on leakage current measurement in field. The embodiments realize the stated goal by a system that has the following operations: detection and correction. The operation of detection measures per core leakage current in the field (e.g., using voltage regulator electrical current counters). The operation of correction changes the device power management behavior. For example, processor cores showing high leakage degradation may be logically swapped with processor cores showing low leakage degradation.

There are many technical effects of the various embodiments. For example, instead of relying on worst case leakage, performance, and/or power specifications and design, the embodiments allow the specification constraints to relax due to the reactive control scheme. Note, accounting for worst case degradation at EoL of a processor drives increased power specifications and lower performance. These negative effects are mitigated by the reactive control scheme for mitigating leakage degradation of various embodiments. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

Here, the term "analog signal" is any continuous signal for which the time varying feature (variable) of the signal is a representation of some other time varying quantity, i.e., analogous to another time varying signal.

Here, the term "digital signal" is a physical signal that is a representation of a sequence of discrete values (a quantified discrete-time signal), for example of an arbitrary bit stream, or of a digitized (sampled and analog-to-digital converted) analog signal.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e g, immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Figure 3:
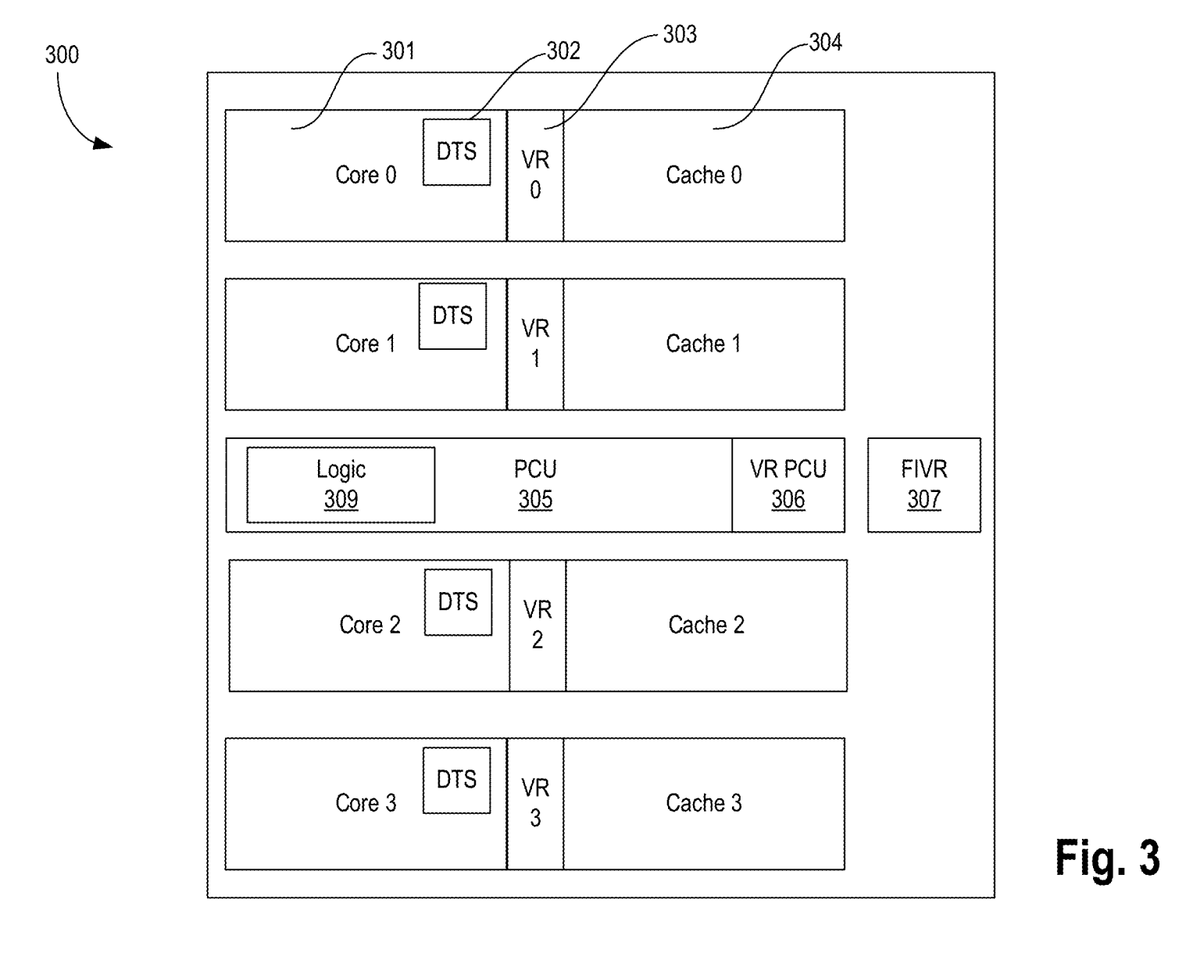
FIG. 3 illustrates a high-level processor architecture with apparatus and scheme for leakage current degradation detection and mitigation, in accordance with some embodiments.

FIG. 3 illustrates a high-level processor architecture 300 with apparatus and scheme for leakage current degradation detection and mitigation, in accordance with some embodiments. Architecture 300 is of a multicore processor comprising four cores 301, digital thermal sensors (DTS) 302, voltage regulators (VRs) 303, caches 304, power control unit (PCU) 305, VR for PCU 306, main fully integrated voltage regulator 307, and logic 309 for leakage current degradation detection and mitigation. The architecture 300 is a simplified view of a system-on-chip of FIG. 6. While four cores are shown, any number of cores can be organized in a multicore processor architecture. The architecture of a multicore processor can be any architecture such as out-of-order machine which is also referred to as an x86 instruction set architecture (ISA), an in-order processor, a reduced instruction set computing (RISC) processor such as an ARM-based processor, or a processor of another type of ISA that can emulate instructions and operations of a different ISA via an emulation engine and associated logic circuitry.

In one embodiment, each such core 301 may be configured to operate at multiple voltages and/or frequencies. In addition, each core may be independently controlled to operate at a selected voltage and/or frequency. To this end, each core 301 may be associated with a corresponding voltage regulator (VR) 303. The various cores may be coupled via an interconnect to an uncore, which includes PCU 305. In some embodiments, processor core 301 is a multi-stage pipelined out-of-order processor and may operate at various voltages and clock frequencies as a result of integrated voltage regulator 303. In some embodiments, VR 303 may receive an incoming voltage signal, e.g., from a fully integrated voltage regulator (FIVR) 307 or an external regulator, and may further receive one or more control signals, e.g., from uncore logic 309 coupled to core 301.

Currently, there are fuses in the processor that describe the leakage at BoL and the leakage dependency in temperature and voltage so PCU 305 can (and does for other existing algorithms such as load line voltage correction) calculate the leakage at any time for a given voltage and temperature. In some embodiments, clocks, phase locked loop(s), and/or voltage supply to the cores 301 can be stopped or squashed for realizing a low power state. Here, the term "squash" generally refers to stopping a toggling of a clock signal, changing frequency of the clock signal (e.g., changing a divider ratio of divider in a phase locked loop), changing clock frequency without changing power supply voltage, changing the frequency or content by a processor core as to measure leakage degradation, reducing voltage on a supply rail, etc. In one example, leakage can be measured by lowering the frequency while keeping the voltage fixed, and extrapolating the results to frequency at zero (F=0). In another example, during squash, voltage on a supply rail can be lowered for realizing a low power state and/or running contend with minimal transistor switching. Examples of low power states are C-states or P-states as described in the Advanced Configuration and Power Interface (ACPI) standard. These low power states can be used to measure and/or estimate leakage current by minimizing dynamic (e.g., caused by transistor toggling) current.

ACPI standard implementation allows processor core 301 to be in different power-saving states (also termed low power or idle states). These power saving states are generally referred to as so-called C1 to Cn states, where 'n' is a number. Similar package C-states exist for package-level power savings. However, such states may not be visible to an operating system (OS). When core 301 is active, it runs at a so-called C0 state. When core 301 is idle, it may be placed in a core low power state, a so-called core non-zero C-state. The core C1 state represents the low power state that has the least power savings. In this case, the processor can enter or exit this power state almost immediately. However, for an extended deep-low power state (e.g., C3), which represents a power state where the static power consumption is negligible, the time to enter/exit this state and respond to activity (i.e., back to C0 state) is longer.

In addition to power-saving states, performance states or so-called P-states are also provided in the ACPI standard. These performance states may allow control of performance-power levels while core 301 is in an active state (C0). In general, multiple P-states may be available, namely from P0-PN states, where 'N' is a number. In general, the ACPI P-state control algorithm optimizes power consumption without impacting performance. The state corresponding to P0 state may operate the core at a maximum voltage and frequency combination for the core. Each P-state, e.g., P1-PN states, operates core 301 at different voltage and/or frequency combinations.

In some embodiments, at any C-state, clock to the cores 301 is stopped or gated at some point. In this case, leakage current is the only current. In some embodiments, different cores may enter different power saving states. This leakage current is measured and compared by logic 309 to an expected leakage at current temperature. As such, any degradation (e.g., increase in leakage current) can be measured. Such, expected leakage at current temperature may be stored in a non-volatile memory (NVM) or burnt in a fuse after the processor is characterized for leakage. Upon detection of a degradation above a certain limit, logic 309 of some embodiments can activate an action. Such action can include one or more of: notifications to a user, adjustment of voltage and/or frequency to the cores, disabling of a core, changing a favored core scheme, limiting a maximum operating frequency and/or voltage to one or more cores or entire processor, etc. In one example, the maximum core frequency and/or voltage is limited to prevent any further damage to the cores.

Changing favored core scheme generally comprises of the OS (operating system) preference to run specific workloads on a specific core that is expected to result in higher performance Higher performance generally refers to higher clock speed and/or lower power. Such favored core scheme exists in devices with different core architecture and/or size (e.g., asymmetric cores in a single system-on-chip).

While various embodiments are described with reference to leakage in a general processor, the embodiments are not limited to such. For example, the embodiment of detection and mitigation of leakage degradation are applicable to graphics processors, custom processors, video processors, artificial intelligence (AI) processor, inference chip, application specific integrated circuit (ASIC), dedicated mathematical computational processor, etc. The scheme of detection and mitigation of leakage degradation can be performed by software and/or hardware.

Figure 4:
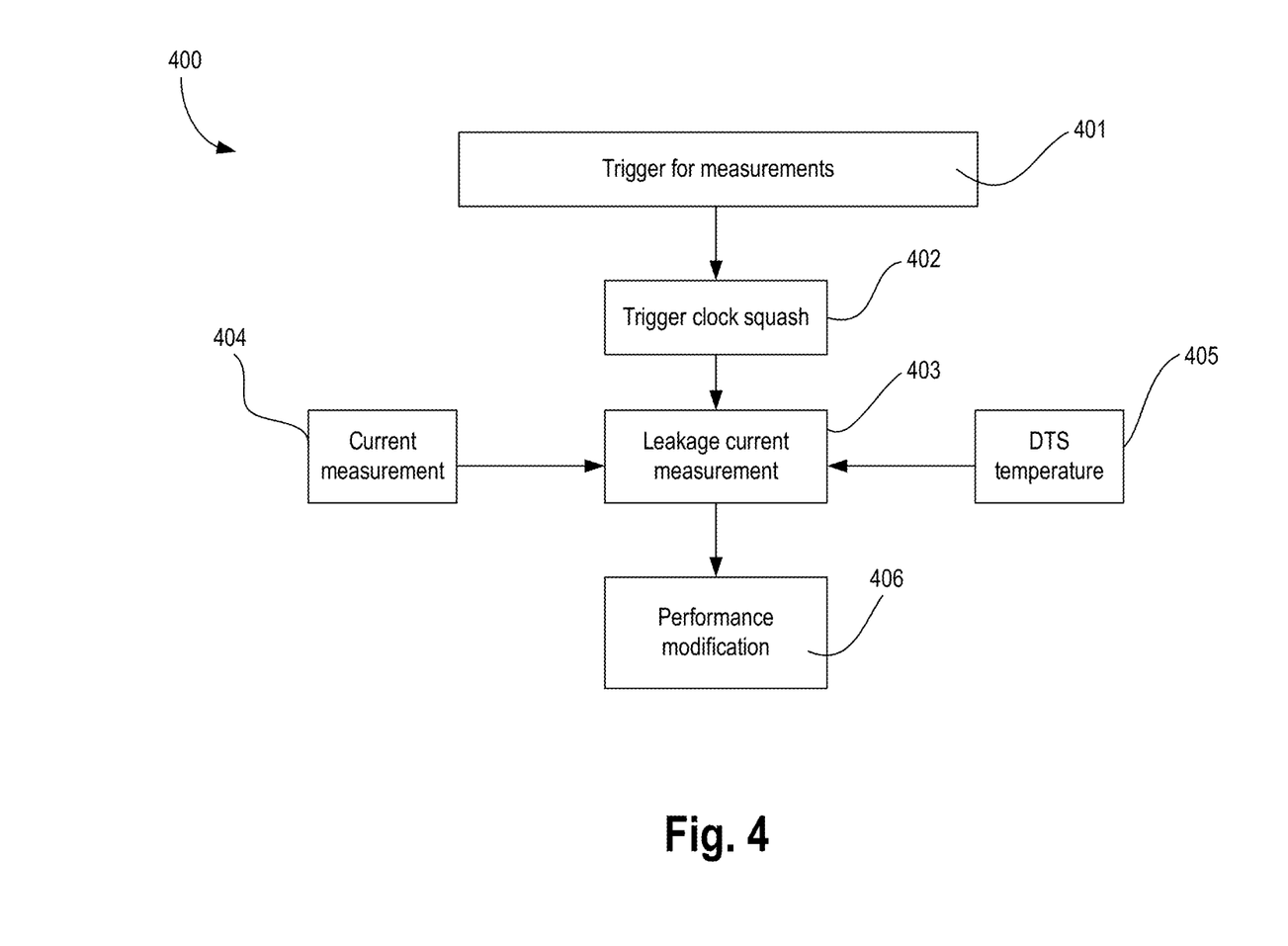
FIG. 4 illustrates a functional view of the process for leakage current degradation detection and mitigation, in accordance with some embodiments.

FIG. 4 illustrates functional view 400 of the process for leakage current degradation detection and mitigation, in accordance with some embodiments. The process comprises two main aspects—detection of leakage current, and correction of processor performance. The processor may be executed by PCU 305. Detection of leakage current comprises measuring per core leakage current in the field (e.g., using VR electrical current counters or leakage sensors). Correction implies changing power management behavior of the processor. For example, using less favored processor core, or updating the leakage current threshold value. In various embodiments, the current measurement is saved in memory, and power management optimizations are performed by PCU 305. In some embodiments, an operating system can perform the function of PCU 305 as it relates to measuring leakage current and/or modifying the performance of the processor in response to the measured leakage current. In some embodiments, a combination of hardware and software is used for measuring leakage current and/or modifying the performance of the processor.

Upon entering a particular state such as boot-up, deep sleep, a counter value, etc. leakage current is measured by logic 309 for the processor. This leakage current can be measured periodically or regularly over a long period of time. For example, leakage current can be measured every 1 to 2 days, once a week, once a month, etc. as indicated by block 401. To measure leakage current, dynamic current or power is suppressed. In one such example, the clocks to the cores 301 are squashed, gated, or turned off at block 402. For instance, a phase locked loop (PLL) is turned off or its output clock is gated. As such, clock through clock distribution network, sequential logics, and other circuits in the core(s) is halted leaving leakage current as the dominant current through those circuits.

At block 403, leakage current is measured. One way to measure leakage current is to measure current through the VRs 303/307. For example, current though the input supply to VRs 303/307 or to the ground node is measured by current sensors. The measured current 404 from various cores and the temperatures 405 from those cores are stored in memory and analyzed. The temperature can be measured by digital thermal sensors (DTS) 302 in various hot spots of the core. If the leakage current degrades above a threshold, which can be predetermined or a programmable threshold, then PCU 305 takes an action as indicated by block 406. Such action can include one or more of: notifications to a user, adjustment of voltage and/or frequency to the cores, disabling of a least favored core, swapping of the least favored core with a spare core or unused core, disabling one of cores, issuing a warning to a user, etc.

Figure 5:
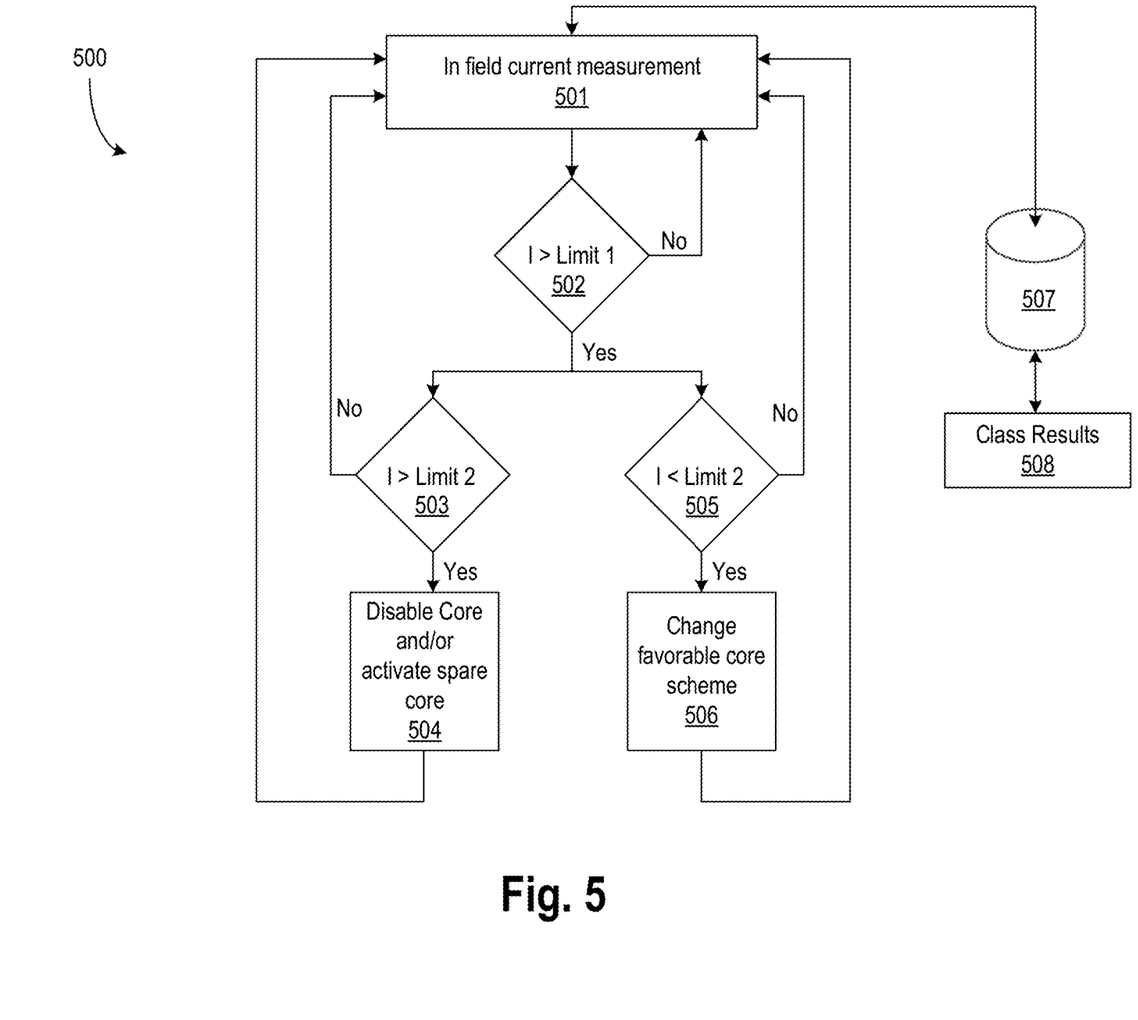
FIG. 5 illustrates a flowchart showing the scheme for leakage current degradation detection and mitigation, in accordance with some embodiments.

FIG. 5 illustrates flowchart 500 showing the scheme for leakage current degradation detection and mitigation, in accordance with some embodiments. While various blocks are shown in a particular order, the order can be changed. For example, some blocks can be executed in parallel, some before others, etc. In some embodiments, flowchart 500 can be performed by p-code executed on PCU 305. P-code is set of machine-executable instructions that can execute of PCU 305. P-code can interact with an OS, and can also perform functions independent of the OS. In some embodiments, flowchart 500 is performed by an OS running on the processor. In some embodiments, other software and/or firmware can be used to perform the various operations of flowchart 500.

A1 block 501, leakage current is measured. For example, leakage current is periodically measured during a determined state (e.g., Core C1e state) and analyzed. This current is measured by current sensors of a VR, for example. The measured leakage current is compared with BoL leakage current stored in memory 507 or the last measured leakage current. As such, changes of leakage current (e.g., rate of change of current) with time are observed. In some embodiments, the measurements can be done periodically during boot or before sleep events so as not to affect user experience. The measurements can be in a specific idle state. In some embodiments, the measurements can be done in a specific test state. As discussed herein, the current can be measured by VRs 303 of the cores and/or by the main FIVR 307.

At block 502, current (I) is compared with a first limit (Limit 1). Limit 1 can be programmable or predetermined. For example, Limit 1 is established by processor characterization before shipping and stored in a NVM. In another example, Limit 1 is adjustable via hardware (e.g., registers) and/or software (e.g., via p-code or OS). In some embodiments, Limit 1 is determined for each process technology node and depends on the reliability of transistors. It may be stored in a fuse. If it is determined that current I is less than or equal to the first limit (Limit 1), the process proceeds to block 501 and leakage current is measured again. If it is determined that current I is greater than the first limit, the process proceeds to blocks 503 and 505 and current is compared with a second limit (Limit 2). Limit 2 can be programmable or predetermined in the same way as Limit 1. In some embodiments, Limit 2 is determined for each process technology node and depends on the reliability of transistors.

If the current I is above Limit 2, that requires power management modification, these modifications are implemented and saved in memory 507. This modification, as previously noted, range from avoiding (as much as possible) the use of a certain core and/or taking into account larger supply voltage droop of the device during use, to issuing a "close to failure" warning and/or disabling a specific core permanently as indicated by block 504. While the former might apply for client products, the later can be a desired feature for reliability critical applications (e.g., advanced driver-assistance systems (ADAS), mobility as a service (MAAS), and Avionics).

If current I is below Limit 2, then it indicates that the process or system is approaching failure point, and the failure can be mitigated by changing the favorable core that experiences high leakage current with a spare core or unused core as indicated by block 506. Other actions can also be taken to mitigate the failure. Such actions include one or more of: clock squashing, notifications to a user, adjustment of voltage and/or frequency to the cores, disabling of a core, changing a favored core scheme, limiting a maximum operating frequency and/or voltage to one or more cores or entire processor, etc.

The process then proceeds to block 501 where leakage current is measured again. In various embodiments, results of leakage current per core at Vmin (minimum operating voltage), favorable cores, most used cores, per core static and dynamic currents, etc. are classified by block 508 (e.g., a logic block that is implemented in hardware and/or software). The classification is stored in memory 507. Here, Vmin generally refers to the minimum operating supply voltage below which the processor or logic fails to operate properly.

While the various embodiments are described with reference to multi-core processors, the scheme for leakage current degradation detection and mitigation is also applicable to single core processors such as a field programmable gate array (FPGA), application specific integrated circuit (ASIC), digital signal processor (DSP), etc.

Elements of embodiments (e.g., flowchart 400, 500, and scheme described with reference to various embodiments) are also provided as a machine-readable medium (e.g., memory) for storing the computer-executable instructions (e.g., instructions to implement any other processes discussed herein). In some embodiments, a computing platform comprises memory, processor, machine-readable storage media (also referred to as tangible machine readable medium), communication interface (e.g., wireless or wired interface), and network bus coupled together.

In some embodiments, the processor is a Digital Signal Processor (DSP), an Application Specific Integrated Circuit (ASIC), a general purpose Central Processing Unit (CPU), or a low power logic implementing a simple finite state machine to perform the method of flowcharts 400-500 and/or various embodiments, etc.

In some embodiments, the various logic blocks of system are coupled together via the network bus. Any suitable protocol may be used to implement the network bus. In some embodiments, the machine-readable storage medium includes instructions (also referred to as the program software code/instructions) for calculating or measuring distance and relative orientation of a device with reference to another device as described with reference to various embodiments and flowchart.

Program software code/instructions associated with flowcharts 400-500 (and/or various embodiments) and executed to implement embodiments of the disclosed subject matter may be implemented as part of an operating system or a specific application, component, program, object, module, routine, or other sequence of instructions or organization of sequences of instructions referred to as "program software code/instructions," "operating system program software code/instructions," "application program software code/instructions," or simply "software" or firmware embedded in processor. In some embodiments, the program software code/instructions associated with flowcharts 400-500 (and/or various embodiments) are executed by the system (e.g., FIG. 7).

In some embodiments, the program software code/instructions associated with flowcharts 400-500 (and/or various embodiments) are stored in a computer executable storage medium and executed by the processor. Here, computer executable storage medium is a tangible machine readable medium that can be used to store program software code/instructions and data that, when executed by a computing device, causes one or more processors to perform a method(s) as may be recited in one or more accompanying claims directed to the disclosed subject matter.

The tangible machine readable medium may include storage of the executable software program code/instructions and data in various tangible locations, including for example ROM, volatile RAM, non-volatile memory and/or cache and/or other tangible memory as referenced in the present application. Portions of this program software code/instructions and/or data may be stored in any one of these storage and memory devices. Further, the program software code/instructions can be obtained from other storage, including, e.g., through centralized servers or peer to peer networks and the like, including the Internet. Different portions of the software program code/instructions and data can be obtained at different times and in different communication sessions or in the same communication session.

The software program code/instructions (associated with flowcharts 400-500 and other embodiments) and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines or other sequences of instructions or organization of sequences of instructions, by way of example. Thus, it is not required that the data and instructions be on a tangible machine readable medium in entirety at a particular instance of time.

Examples of tangible computer-readable media 503 include but are not limited to recordable and non-recordable type media such as volatile and non-volatile memory devices, read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs), etc.), among others. The software program code/instructions may be temporarily stored in digital tangible communication links while implementing electrical, optical, acoustical or other forms of propagating signals, such as carrier waves, infrared signals, digital signals, etc. through such tangible communication links.

In general, the tangible machine readable medium includes any tangible mechanism that provides (i.e., stores and/or transmits in digital form, e.g., data packets) information in a form accessible by a machine (i.e., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Galaxy®, Blackberry®, or the like, or any other device including a computing device. In one embodiment, processor-based system is in a form of or included within a PDA (personal digital assistant), a cellular phone, a notebook computer, a tablet, a game console, a set top box, an embedded system, a TV (television), a personal desktop computer, etc. Alternatively, the traditional communication applications and subsidized application(s) may be used in some embodiments of the disclosed subject matter.

Figure 6:
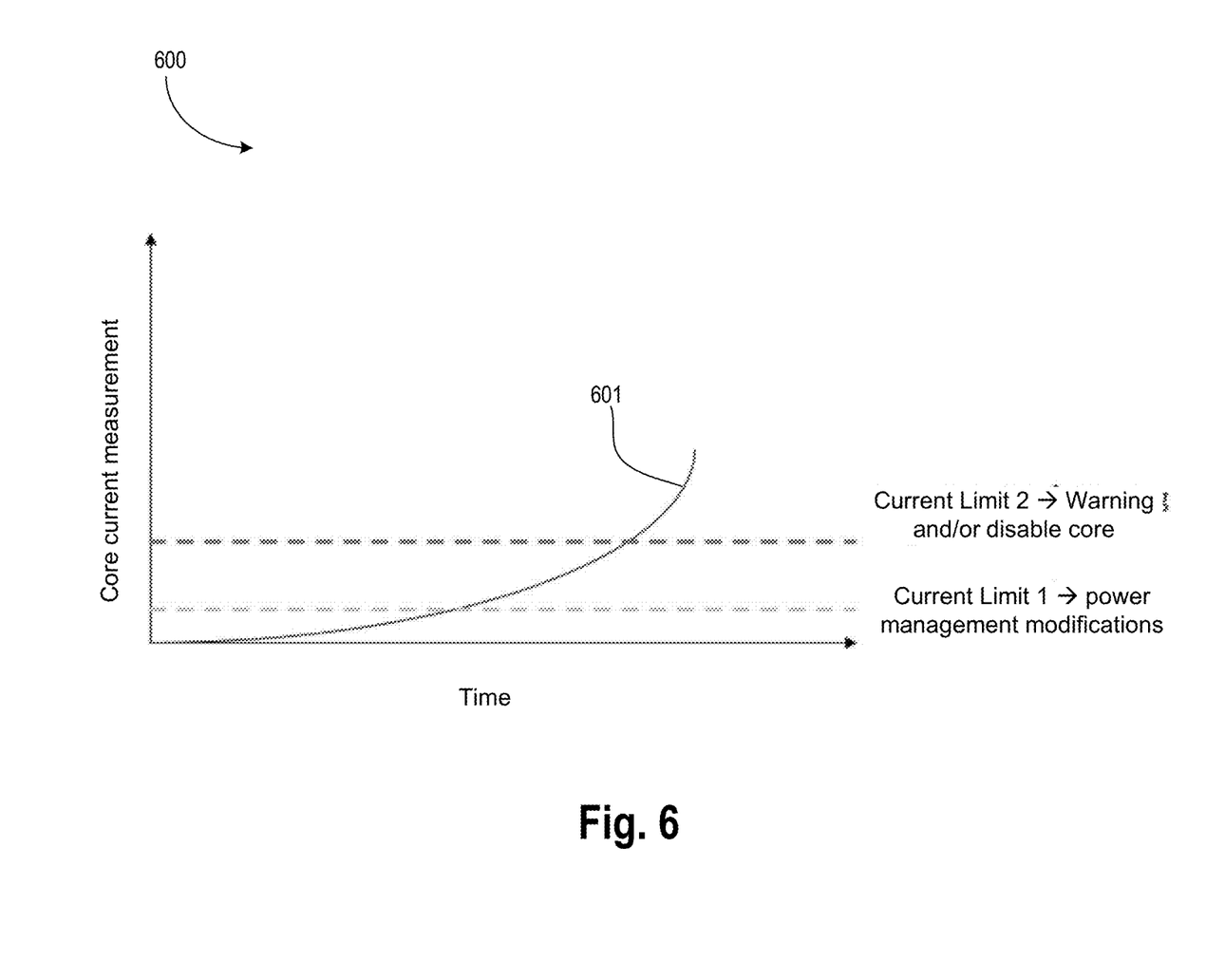
FIG. 6 illustrates a plot showing processor core current in view of the current limits for leakage current degradation detection and mitigation, in accordance with some embodiments.

FIG. 6 illustrates plot 600 showing core current consumption measurement 601 and current limits to trigger action, in accordance with some embodiments. When the current measurement I exceeds Limit 1 (but is less than Limit 2), then PCU 305 (or any power management (PM) logic) takes a first set of actions (e.g., change p-code to avoid blue screen, change favorable core scheme, etc.). When the current measurement I exceeds Limit 2, then the user may be warned via a notification (e.g., source, email, etc.) and one or more cores may be disabled.

Figure 7:
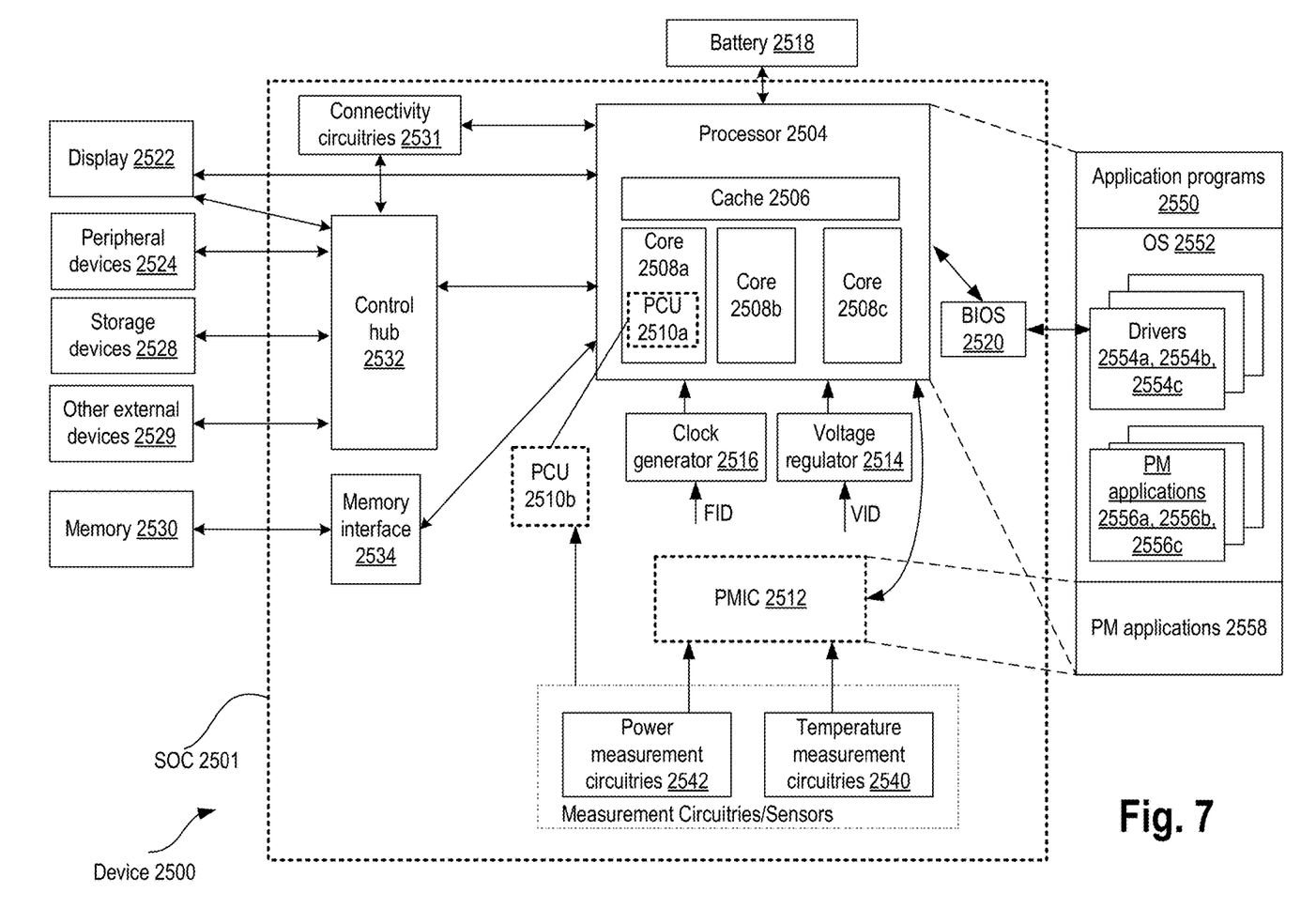
FIG. 7 illustrates a smart device, or a computer system, or a SoC (System-on-Chip) with apparatus for leakage current degradation detection and mitigation, according to some embodiments of the disclosure.

FIG. 7 illustrates a smart device, or a computer system, or a SoC (System-on-Chip) with apparatus for leakage current degradation detection and mitigation, according to some embodiments of the disclosure. In some embodiments, device 2500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2500. Any components here can have with apparatus for leakage current degradation detection and mitigation.

In an example, the device 2500 comprises a SoC (System-on-Chip) 2501. An example boundary of the SOC 2501 is illustrated using dotted lines in FIG. 7, with some example components being illustrated to be included within SOC 2501—however, SOC 2501 may include any appropriate components of device 2500.

In some embodiments, device 2500 includes processor 2504. Processor 2504 can include one or more physical devices, such as microprocessors, application processors, microcontrollers, programmable logic devices, processing cores, or other processing means. The processing operations performed by processor 2504 include the execution of an operating platform or operating system on which applications and/or device functions are executed. The processing operations include operations related to I/O (input/output) with a human user or with other devices, operations related to power management, operations related to connecting computing device 2500 to another device, and/or the like. The processing operations may also include operations related to audio I/O and/or display I/O.

In some embodiments, processor 2504 includes multiple processing cores (also referred to as cores) 2508a, 2508b, 2508c. Although merely three cores 2508a, 2508b, 2508c are illustrated, processor 2504 may include any other appropriate number of processing cores, e.g., tens, or even hundreds of processing cores. Processor cores 2508a, 2508b, 2508c may be implemented on a single integrated circuit (IC) chip. Moreover, the chip may include one or more shared and/or private caches, buses or interconnections, graphics and/or memory controllers, or other components.

In some embodiments, processor 2504 includes cache 2506. In an example, sections of cache 2506 may be dedicated to individual cores 2508 (e.g., a first section of cache 2506 dedicated to core 2508a, a second section of cache 2506 dedicated to core 2508b, and so on). In an example, one or more sections of cache 2506 are shared among two or more of cores 2508. Cache 2506 may be split in different levels, e.g., level 1 (L1) cache, level 2 (L2) cache, level 3 (L3) cache, etc.

In some embodiments, processor core 2504 may include a fetch unit to fetch instructions (including instructions with conditional branches) for execution by the core 2504. The instructions are fetched from any storage devices such as the memory 2530. Processor core 2504 may also include a decode unit to decode the fetched instruction. For example, the decode unit may decode the fetched instruction into a plurality of micro-operations. Processor core 2504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2504 may be an out-of-order processor core in one embodiment. Processor core 2504 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 2504 may also include a bus unit to enable communication between components of the processor core 2504 and other components via one or more buses. Processor core 2504 may also include one or more registers to store data accessed by various components of the core 2504 (such as values related to assigned app priorities and/or sub-system states (modes) association.

In some embodiments, device 2500 comprises connectivity circuitries 2531. For example, connectivity circuitries 2531 includes hardware devices (e.g., wireless and/or wired connectors and communication hardware) and/or software components (e.g., drivers, protocol stacks), e.g., to enable device 2500 to communicate with external devices. Device 2500 may be separate from the external devices, such as other computing devices, wireless access points or base stations, etc.

In an example, connectivity circuitries 2531 may include multiple different types of connectivity. To generalize, the connectivity circuitries 2531 may include cellular connectivity circuitries, wireless connectivity circuitries, etc. Cellular connectivity circuitries of connectivity circuitries 2531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2531 may include a network interface, such as a wired or wireless interface, e.g., so that a system embodiment may be incorporated into a wireless device, for example, cell phone or personal digital assistant.

In some embodiments, device 2500 comprises control hub 2532, which represents hardware devices and/or software components related to interaction with one or more I/O devices. For example, processor 2504 may communicate with one or more of display 2522, one or more peripheral devices 2524, storage devices 2528, one or more other external devices 2529, etc., via control hub 2532. Control hub 2532 may be a chipset, a Platform Control Hub (PCH), and/or the like.

For example, control hub 2532 illustrates one or more connection points for additional devices that connect to device 2500, e.g., through which a user might interact with the system. For example, devices (e.g., devices 2529) that can be attached to device 2500 include microphone devices, speaker or stereo systems, audio devices, video systems or other display devices, keyboard or keypad devices, or other I/O devices for use with specific applications such as card readers or other devices.

As mentioned above, control hub 2532 can interact with audio devices, display 2522, etc. For example, input through a microphone or other audio device can provide input or commands for one or more applications or functions of device 2500. Additionally, audio output can be provided instead of, or in addition to display output. In another example, if display 2522 includes a touch screen, display 2522 also acts as an input device, which can be at least partially managed by control hub 2532. There can also be additional buttons or switches on computing device 2500 to provide I/O functions managed by control hub 2532. In one embodiment, control hub 2532 manages devices such as accelerometers, cameras, light sensors or other environmental sensors, or other hardware that can be included in device 2500. The input can be part of direct user interaction, as well as providing environmental input to the system to influence its operations (such as filtering for noise, adjusting displays for brightness detection, applying a flash for a camera, or other features).

In some embodiments, control hub 2532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2522 represents hardware (e.g., display devices) and software (e.g., drivers) components that provide a visual and/or tactile display for a user to interact with device 2500. Display 2522 may include a display interface, a display screen, and/or hardware device used to provide a display to a user. In some embodiments, display 2522 includes a touch screen (or touch pad) device that provides both output and input to a user. In an example, display 2522 may communicate directly with the processor 2504. Display 2522 can be one or more of an internal display device, as in a mobile electronic device or a laptop device or an external display device attached via a display interface (e.g., DisplayPort, etc.). In one embodiment display 2522 can be a head mounted display (HMD) such as a stereoscopic display device for use in virtual reality (VR) applications or augmented reality (AR) applications.

In some embodiments and although not illustrated in the figure, in addition to (or instead of) processor 2504, device 2500 may include Graphics Processing Unit (GPU) comprising one or more graphics processing cores, which may control one or more aspects of displaying contents on display 2522.

Control hub 2532 (or platform controller hub) may include hardware interfaces and connectors, as well as software components (e.g., drivers, protocol stacks) to make peripheral connections, e.g., to peripheral devices 2524.

It will be understood that device 2500 could both be a peripheral device to other computing devices, as well as have peripheral devices connected to it. Device 2500 may have a "docking" connector to connect to other computing devices for purposes such as managing (e.g., downloading and/or uploading, changing, synchronizing) content on device 2500. Additionally, a docking connector can allow device 2500 to connect to certain peripherals that allow computing device 2500 to control content output, for example, to audiovisual or other systems.

In addition to a proprietary docking connector or other proprietary connection hardware, device 2500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2531 may be coupled to control hub 2532, e.g., in addition to, or instead of, being coupled directly to the processor 2504. In some embodiments, display 2522 may be coupled to control hub 2532, e.g., in addition to, or instead of, being coupled directly to processor 2504.

In some embodiments, device 2500 comprises memory 2530 coupled to processor 2504 via memory interface 2534. Memory 2530 includes memory devices for storing information in device 2500. Memory can include nonvolatile (state does not change if power to the memory device is interrupted) and/or volatile (state is indeterminate if power to the memory device is interrupted) memory devices. Memory device 2530 can be a dynamic random access memory (DRAM) device, a static random access memory (SRAM) device, flash memory device, phase-change memory device, or some other memory device having suitable performance to serve as process memory. In one embodiment, memory 2530 can operate as system memory for device 2500, to store data and instructions for use when the one or more processors 2504 executes an application or process. Memory 2530 can store application data, user data, music, photos, documents, or other data, as well as system data (whether long-term or temporary) related to the execution of the applications and functions of device 2500.

Elements of various embodiments and examples are also provided as a machine-readable medium (e.g., memory 2530) for storing the computer-executable instructions (e.g., instructions to implement any other processes discussed herein). The machine-readable medium (e.g., memory 2530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2500 comprises temperature measurement circuitries 2540, e.g., for measuring temperature of various components of device 2500. In an example, temperature measurement circuitries 2540 may be embedded, or coupled or attached to various components, whose temperature are to be measured and monitored. For example, temperature measurement circuitries 2540 may measure temperature of (or within) one or more of cores 2508*a*, 2508*b*, 2508*c*, voltage regulator 2514, memory 2530, a mother-board of SOC 2501, and/or any appropriate component of device 2500.

In some embodiments, device 2500 comprises power measurement circuitries 2542, e.g., for measuring power consumed by one or more components of the device 2500. In an example, in addition to, or instead of, measuring power, the power measurement circuitries 2542 may measure voltage and/or current. In an example, the power measurement circuitries 2542 may be embedded, or coupled or attached to various components, whose power, voltage, and/or current consumption are to be measured and monitored. For example, power measurement circuitries 2542 may measure power, current and/or voltage supplied by one or more voltage regulators 2514, power supplied to SOC 2501, power supplied to device 2500, power consumed by processor 2504 (or any other component) of device 2500, etc.

In some embodiments, device 2500 comprises one or more voltage regulator circuitries, generally referred to as voltage regulator (VR) 2514 VR having a high bandwidth and low power differential-to-single-ended type-III compensator. VR 2514 generates signals at appropriate voltage levels, which may be supplied to operate any appropriate components of the device 2500. Merely as an example, VR 2514 is illustrated to be supplying signals to processor 2504 of device 2500. In some embodiments, VR 2514 receives one or more Voltage Identification (VID) signals, and generates the voltage signal at an appropriate level, based on the VID signals. Various type of VRs may be utilized for the VR 2514. For example, VR 2514 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 2510*a/b* and/or PMIC 2512. In some embodiments, each core has a network of distributed LDOs to provide efficient control for power management. The LDOs can be digital, analog, or a combination of digital or analog LDOs. The VR is an adaptive VR that can provide an adaptive voltage output as discussed with reference to various embodiments.

In some embodiments, device 2500 comprises one or more clock generator circuitries, generally referred to as clock generator 2516. Clock generator 2516 generates clock signals at appropriate frequency levels, which may be supplied to any appropriate components of device 2500. Merely as an example, clock generator 2516 is illustrated to be supplying clock signals to processor 2504 of device 2500. In some embodiments, clock generator 2516 receives one or more Frequency Identification (FID) signals, and generates the clock signals at an appropriate frequency, based on the FID signals. Clock generator 2516 is an adaptive clock source that can provide an adaptive frequency output as discussed with reference to various embodiments.

In some embodiments, device 2500 comprises battery 2518 supplying power to various components of device 2500. Merely as an example, battery 2518 is illustrated to be supplying power to processor 2504. Although not illustrated in the figures, device 2500 may comprise a charging circuitry, e.g., to recharge the battery, based on Alternating Current (AC) power supply received from an AC adapter.

In some embodiments, device 2500 comprises Power Control Unit (PCU) 2510 (also referred to as Power Management Unit (PMU), Power Controller, etc.). In an example, some sections of PCU 2510 may be implemented by one or more processing cores 2508, and these sections of PCU 2510 are symbolically illustrated using a dotted box and labelled PCU 2510*a*. In an example, some other sections of PCU 2510 may be implemented outside the processing cores 2508, and these sections of PCU 2510 are symbolically illustrated using a dotted box and labelled as PCU 2510*b*. PCU 2510 may implement various power management operations for device 2500. PCU 2510 may include hardware interfaces, hardware circuitries, connectors, registers, etc., as well as software components (e.g., drivers, protocol stacks), to implement various power management operations for device 2500.

In some embodiments, device 2500 comprises Power Management Integrated Circuit (PMIC) 2512, e.g., to implement various power management operations for device 2500. In some embodiments, PMIC 2512 is a Reconfigurable Power Management ICs (RPMICs) and/or an IMVP (Intel® Mobile Voltage Positioning). In an example, the PMIC is within an IC chip separate from processor 2504. The may implement various power management operations for device 2500. PMIC 2512 may include hardware interfaces, hardware circuitries, connectors, registers, etc., as well as software components (e.g., drivers, protocol stacks), to implement various power management operations for device 2500.

In an example, device 2500 comprises one or both PCU 2510 or PMIC 2512. In an example, any one of PCU 2510 or PMIC 2512 may be absent in device 2500, and hence, these components are illustrated using dotted lines.

Various power management operations of device 2500 may be performed by PCU 2510, by PMIC 2512, or by a combination of PCU 2510 and PMIC 2512. For example, PCU 2510 and/or PMIC 2512 may select a power state (e.g., P-state) for various components of device 2500. For example, PCU 2510 and/or PMIC 2512 may select a power state (e.g., in accordance with the ACPI (Advanced Configuration and Power Interface) specification) for various components of device 2500. Merely as an example, PCU 2510 and/or PMIC 2512 may cause various components of the device 2500 to transition to a sleep state, to an active state, to an appropriate C state (e.g., C0 state, or another appropriate C state, in accordance with the ACPI specification), etc. In an example, PCU 2510 and/or PMIC 2512 may control a voltage output by VR 2514 (e.g., SCVR) and/or a frequency of a clock signal output by the clock generator, e.g., by outputting the VID signal and/or the FID signal, respectively. In an example, PCU 2510 and/or PMIC 2512 may control battery power usage, charging of battery 2518, and features related to power saving operation.

The clock generator 2516 can comprise a phase locked loop (PLL), frequency locked loop (FLL), or any suitable clock source. In some embodiments, each core of processor 2504 has its own clock source. As such, each core can operate at a frequency independent of the frequency of operation of the other core. In some embodiments, PCU 2510 and/or PMIC 2512 performs adaptive or dynamic frequency scaling or adjustment. For example, clock frequency of a processor core can be increased if the core is not operating at its maximum power consumption threshold or limit. In some embodiments, PCU 2510 and/or PMIC 2512 determines the operating condition of each core of a processor, and opportunistically adjusts frequency and/or power supply voltage of that core without the core clocking source (e.g., PLL of that core) losing lock when the PCU 2510 and/or PMIC 2512 determines that the core is operating below a target performance level. For example, if a core is drawing current from a power supply rail less than a total current allocated for that core or processor 2504, then PCU 2510 and/or PMIC 2512 can temporality increase the power draw for that core or processor 2504 (e.g., by increasing clock frequency and/or power supply voltage level) so that the core or processor 2504 can perform at higher performance level. As such, voltage and/or frequency can be increased temporality for processor 2504 without violating product reliability.

In an example, PCU 2510 and/or PMIC 2512 may perform power management operations, e.g., based at least in part on receiving measurements from power measurement circuitries 2542, temperature measurement circuitries 2540, charge level of battery 2518, and/or any other appropriate information that may be used for power management. To that end, PMIC 2512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2510 and/or PMIC 2512 in at least one embodiment to allow PCU 2510 and/or PMIC 2512 to manage processor core energy at least in part based on value(s) detected by one or more of the sensors.

Also illustrated is an example software stack of device 2500 (although not all elements of the software stack are illustrated). Merely as an example, processors 2504 may execute application programs 2550, Operating System 2552, one or more Power Management (PM) specific application programs (e.g., generically referred to as PM applications 2558), and/or the like. PM applications 2558 may also be executed by the PCU 2510 and/or PMIC 2512. OS 2552 may also include one or more PM applications 2556*a*, 2556*b*, 2556*c*. The OS 2552 may also include various drivers 2554*a*, 2554*b*, 2554*c*, etc., some of which may be specific for power management purposes. In some embodiments, device 2500 may further comprise a Basic Input/Output System (BIOS) 2520. BIOS 2520 may communicate with OS 2552 (e.g., via one or more drivers 2554), communicate with processors 2504, etc.

For example, one or more of PM applications 2558, 2556, drivers 2554, BIOS 2520, etc. may be used to implement power management specific tasks, e.g., to control voltage and/or frequency of various components of device 2500, to control wake-up state, sleep state, and/or any other appropriate power state of various components of device 2500, control battery power usage, charging of the battery 2518, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1

An apparatus comprising: a first processor core; a second processor core; and a power control unit (PCU) coupled to the first and second processor cores, wherein the PCU comprises logic to: measure a first leakage current through the first processor core; measure a second leakage current through the second processor core; determine whether the first and/or second leakage currents are above a threshold; and modify voltage and/or frequency of the first and/or second processor core in response to a determination that the first and/or second leakage currents are above the threshold.

Example 2

The apparatus of example 1, wherein the PCU is to squash a first clock of the first processor core to measure the first leakage current, and wherein the PCU is to squash a second clock of the second processor core to measure the second leakage current.

Example 3

The apparatus of example 1 comprises a first voltage regulator (VR) to supply a first power supply to the first processor core, wherein the PCU is to measure the first leakage current with a current sensor associated with the first VR.

Example 4

The apparatus of example 1 comprises a second voltage regulator (VR) to supply a second power supply to the second processor core, wherein the PCU is to measure the second leakage current with a current sensor associated with the second VR.

Example 5

The apparatus of example 1, wherein the PCU is to measure the first leakage current at a first temperature of the first processor core, wherein the first processor core includes a first thermometer sensor to measure the first temperature.

Example 6

The apparatus of example 1, wherein the PCU is to measure the second leakage current at a second temperature of the second processor core, wherein the second processor core includes a second thermometer sensor to measure the second temperature.

Example 7

The apparatus of example 1, wherein the PCU is to disable one of the first or second processor cores and replace the disabled processor core with a third processor core if it is determined that the first or second leakage currents are above the threshold.

Example 8

The apparatus of example 1, wherein the PCU is to measure the first and/or second leakage currents periodically.

Example 9

The apparatus of example 1, wherein the PCU is to measure the first and second leakage currents periodically upon boot up or a low power state.

Example 10

A machine-readable storage media having machine readable instructions, that when executed, cause a machine to perform one or more operations including: measure a first leakage current through a first processor core; measure a second leakage current through a second processor core; determine whether the first and/or second leakage currents are above a threshold; and take an action associated with the first and/or second processor cores in response to a determination that the first and/or second leakage currents are above the threshold, wherein the action includes one or more of: disable one of the first or second processor cores, issue a warning to a user, or modify a voltage and/or frequency of the first and/or second processor cores.

Example 11

The machine-readable storage media of example 10 having machine readable instructions, that when executed, cause a machine to perform one or more operations including: modify a first clock of the first processor core to measure the first leakage current, and modify a second clock of the second processor core to measure the second leakage current.

Example 12

The machine-readable storage media of example 10 having machine readable instructions, that when executed, cause a machine to perform one or more operations including: measure the first leakage current with a current sensor associated with a first VR, wherein the first VR is to supply a first power supply to the first processor core.

Example 13

The machine-readable storage media of example 10 having machine readable instructions, that when executed, cause a machine to perform one or more operations including: measure the second leakage current with a current sensor associated with a second VR, wherein the second VR is to supply a second power supply to the second processor core.

Example 14

The machine-readable storage media of example 10 having machine readable instructions, that when executed, cause a machine to perform one or more operations including: measure the first leakage current at a first temperature of the first processor core, wherein the first processor core includes a first thermometer sensor to measure the first temperature.

Example 15

The machine-readable storage media of example 10 having machine readable instructions, that when executed, cause a machine to perform one or more operations including: measure the second leakage current at a second temperature of the second processor core, wherein the second processor core includes a second thermometer sensor to measure the second temperature.

Example 16

The machine-readable storage media of example 10 having machine readable instructions, that when executed, cause a machine to perform one or more operations including: measure the first and second leakage currents periodically.

Example 17

The machine-readable storage media of example 10 having machine readable instructions, that when executed, cause a machine to perform one or more operations including: measure the first and second leakage currents periodically upon boot up or a low power state.

Example 18

A system comprising: a memory; a processor coupled to the memory; a wireless interface to allow the processor to communicate with another device, wherein the processor includes: a first processor core; a second processor core; and a power control unit (PCU) coupled to the first and second processor cores, wherein the PCU comprises logic to: measure a first leakage current through the first processor core; measure a second leakage current through the second processor core; determine whether the first and/or second leakage currents are above a threshold; and modify voltage and/or frequency of the first and/or second processor core in response to a determination that the first and/or second leakage currents are above the threshold.

Example 19

The system of example 18, wherein the PCU is to squash a first clock of the first processor core to measure the first leakage current, and wherein the PCU is to squash a second clock of the second processor core to measure the second leakage current.

Example 20

The system of example 18 wherein: the first processor core comprises a first voltage regulator (VR) to supply a first power supply to the first processor core, wherein the PCU is to measure the first leakage current with a current sensor associated with the first VR; and the second processor core comprises a second voltage regulator (VR) to supply a second power supply to the second processor core, wherein the PCU is to measure the second leakage current with a current sensor associated with the second VR.

Example 21

An apparatus comprising: a processor core; and a logic coupled to the processor core, wherein the logic is to: measure a leakage current through the processor core; determine whether the leakage current is above a threshold; and modify voltage and/or frequency of the processor core in response to a determination that the leakage current is above the threshold, wherein the logic is to measure, determine, and modify on a regular basis.

Example 22

The apparatus of example 21, wherein the logic is to squash a clock of the processor core to measure the leakage current.

Example 23

The apparatus of example 21 comprises a voltage regulator (VR) to supply a power supply to the processor core, wherein the logic is to measure the leakage current with a current sensor associated with the VR.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:
    a processor core; and
    a power control unit (PCU) coupled to the processor core, wherein the PCU is to:
        obtain a measurement of a leakage current through the processor core;
        obtain a temperature from a temperature sensor;
        obtain data stored in non-volatile memory indicating a beginning-of-life leakage current of the processor core and a dependency of the beginning-of-life leakage current on the temperature;
        determine a change in the leakage current through the processor core based on the measurement, the temperature, and the data indicating the beginning-of-life leakage current and the dependency of the beginning-of-life leakage current on the temperature; and
        perform a corrective action for the processor core if the change exceeds one or more thresholds.

2. The apparatus of claim 1, wherein:
    the one or more thresholds comprise a first threshold and a second threshold, which is greater than the first threshold;
    if the change exceeds the first threshold but not the second threshold, the PCU is to perform a first corrective action for the processor core; and
    if the change exceeds the second threshold, the PCU is to perform a second corrective action for the processor core.

3. The apparatus of claim 2, wherein the first corrective action is to replace the processor core as a favored core with a spare processor core.

4. The apparatus of claim 2, wherein the second corrective action is to disable the processor core and activate a spare processor core.

5. The apparatus of claim 2, wherein the second corrective action is to issue a warning indicating the processor core is close to failure.

6. The apparatus of claim 1, further comprising a voltage regulator to supply power to the processor core, wherein the PCU is to obtain the measurement with a current sensor associated with the voltage regulator.

7. The apparatus of claim 1, wherein the PCU is to determine the change in the leakage current through the processer core relative to the beginning-of-life leakage current of the processor core.

8. The apparatus of claim 7, wherein the non-volatile memory comprises fuses.

9. The apparatus of claim 7, wherein the change in the leakage current through the processer core is based on a voltage dependency of the beginning-of-life leakage current.

10. The apparatus of claim 1, wherein the PCU is to obtain the measurement when the processor core is in a deep low-power state.

11. The apparatus of claim 1, wherein the PCU is to obtain the measurement upon boot up of the processor core.

12. The apparatus of claim 1, wherein the PCU is to determine the change in the leakage current through the processer core relative to a last measured leakage current of the processor core.

13. A non-transitory machine-readable storage media having machine readable instructions that, when executed by a processor, cause the processor to perform operations comprising:
    obtaining a temperature from a temperature sensor; and
    for each processor core of a plurality of processor cores of the processor:
        obtaining a measurement of a leakage current through the processor core;
        obtaining data stored in non-volatile memory indicating a beginning-of-life leakage current of the processor core and a dependency of the beginning-of-life leakage current on the temperature;
        determining a change of the leakage current through the processor core based on the measurement, the temperature, and the data indicating the beginning-of-life leakage current and the dependency of the beginning-of-life leakage current on the temperature;
        comparing the change to one or more thresholds; and
        determining whether to take a corrective action for the processor core based on the comparing.

14. The non-transitory machine-readable storage media of claim 13, wherein the operations performed further comprise:
    for at least one processor core of the plurality of processor cores, stopping a clock of the processor core to obtain the measurement of the leakage current through the processor core.

15. The non-transitory machine-readable storage media of claim 13, wherein:
    each processor core of the plurality of processor cores is independently controlled to operate at a respective voltage provided by a corresponding voltage regulator; and
    for each processor core of the plurality of processor cores, the measurement of the leakage current through the processor core is obtained with a current sensor associated with the corresponding voltage regulator.

16. The non-transitory machine-readable storage media of claim 13, wherein the respective beginning-of-life leakage current is different for different processor cores of the plurality of processor cores.

17. The non-transitory machine-readable storage media of claim 13, wherein the operations performed further comprise:
    for each processor core, determining the change of leakage current based on voltage-dependency of the beginning-of-life leakage current of the processor core.

18. A system, comprising:
    a plurality of processor cores;
    a respective temperature sensor for each processor core; and
    a power control unit (PCU) coupled to the plurality of processor cores, wherein for each processor core of the plurality of processor cores, the PCU is to:
        measure a leakage current through the processor core;
        obtain a temperature from the respective temperature sensor;
        obtain data stored in fuses or other non-volatile memory indicating a beginning-of-life leakage current of the processor core and a dependency of the beginning-of-life leakage current on the temperature;
        determine a change in leakage current through the processor core based on the measured leakage current, the temperature from the temperature sensor, and the data indicating the beginning-of-life leakage current and the dependency of the beginning-of-life leakage current on the temperature; and compare the change in leakage current through the processor core to one or more thresholds to determine whether to take a corrective action.

19. The system of claim 18, wherein to measure the leakage current through each processor core, the PCU is to stop a clock of each processor core.

20. An apparatus, comprising:
a non-volatile memory;
a processor core; and
logic circuitry coupled to the processor core, wherein the logic circuitry is to:
obtain a first measurement of a leakage current through the processor core at a first time;
store the first measurement in the non-volatile memory as a beginning-of-life leakage current;
obtain a second measurement of a leakage current through the processor core at a second time which is after the first time;
read the non-volatile memory to obtain data indicating the beginning-of-life leakage current and a dependency of the beginning-of-life leakage current on temperature;
determine a rate of change of the leakage current through the processor core based on the second measurement of the leakage current, a temperature, and the data indicating the beginning-of-life leakage current and the dependency of the beginning-of-life leakage current on the temperature; and
determine whether to perform a corrective action for the processor core based on the rate of change of the leakage current through the processor core.

21. The apparatus of claim 20, wherein the logic circuitry is to squash a clock of the processor core to obtain the first and second measurements of the leakage current through the processor core.

* * * * *